United States Patent
Kando et al.

(10) Patent No.: US 8,569,926 B2
(45) Date of Patent: Oct. 29, 2013

(54) MANUFACTURING METHOD FOR BOUNDARY ACOUSTIC WAVE DEVICE AND BOUNDARY ACOUSTIC WAVE DEVICE

(75) Inventors: Hajime Kando, Nagaokakyo (JP); Mari Saji, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 106 days.

(21) Appl. No.: 13/215,309

(22) Filed: Aug. 23, 2011

(65) Prior Publication Data
US 2012/0049691 A1    Mar. 1, 2012

(30) Foreign Application Priority Data

Aug. 27, 2010  (JP) .................................. 2010-190900
May 24, 2011  (JP) .................................. 2011-116117

(51) Int. Cl.
*H01L 41/08*  (2006.01)

(52) U.S. Cl.
USPC .................................. 310/313 R; 310/313 A

(58) Field of Classification Search
USPC .................................. 310/334; 333/195–197
See application file for complete search history.

(56) References Cited

U.S. PATENT DOCUMENTS

| | | | | |
|---|---|---|---|---|
| 7,863,801 B2 * | 1/2011 | Kadota | ..................... | 310/313 A |
| 7,876,020 B2 * | 1/2011 | Mimura | ..................... | 310/313 B |
| 8,074,341 B2 * | 12/2011 | Kando et al. | ..................... | 29/594 |
| 8,143,762 B2 * | 3/2012 | Nakahashi | ................ | 310/313 B |
| 8,179,017 B2 * | 5/2012 | Yamane | ..................... | 310/313 R |
| 8,248,186 B2 * | 8/2012 | Kando et al. | .................. | 333/193 |
| 8,344,589 B2 * | 1/2013 | Yaoi et al. | ................. | 310/313 B |
| 8,381,386 B2 * | 2/2013 | Kando | ............. | 29/594 |
| 2009/0200894 A1 | 8/2009 | Kando et al. | | |

FOREIGN PATENT DOCUMENTS

WO    2008/062639 A1    5/2008

\* cited by examiner

*Primary Examiner* — Mark Budd
(74) *Attorney, Agent, or Firm* — Keating & Bennett, LLP

(57) ABSTRACT

A manufacturing method for a boundary acoustic wave device is capable of certainly providing the boundary acoustic wave device with desired target frequency characteristics. The manufacturing method for the boundary acoustic wave device includes a process for preparing a laminated body that includes a first medium, a second medium laminated on the first medium, and an IDT electrode that is disposed at an interface between the first and second media, and a process for implanting ions from an outer portion of the second medium and adjusting a frequency.

4 Claims, 12 Drawing Sheets

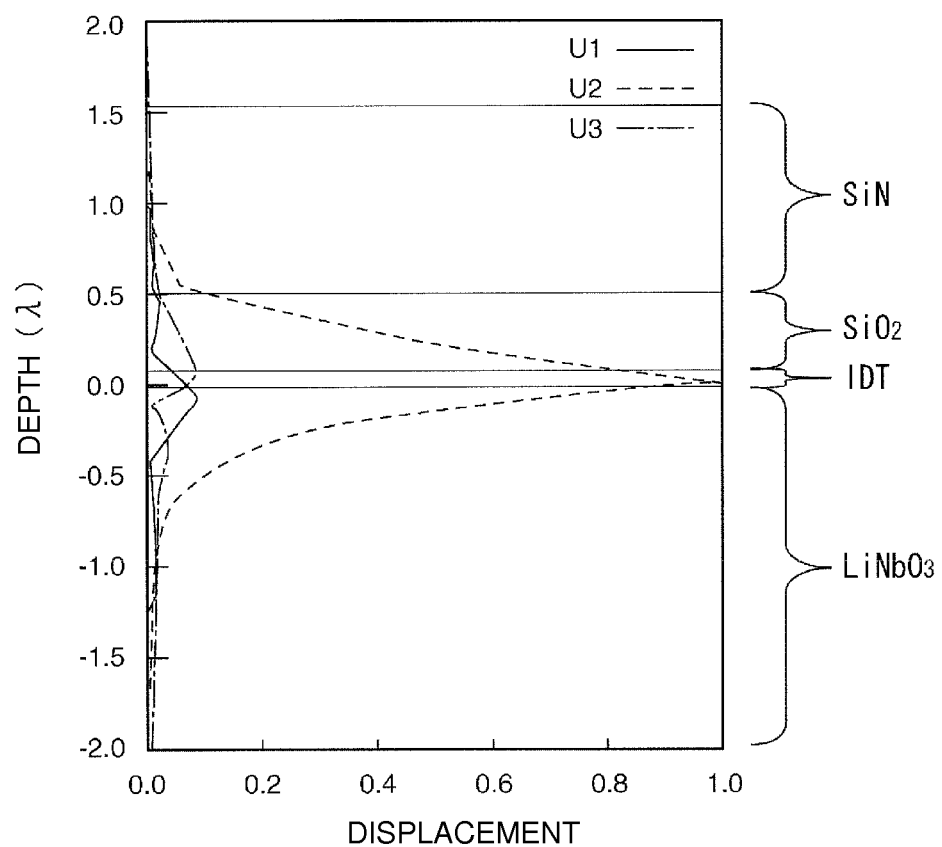

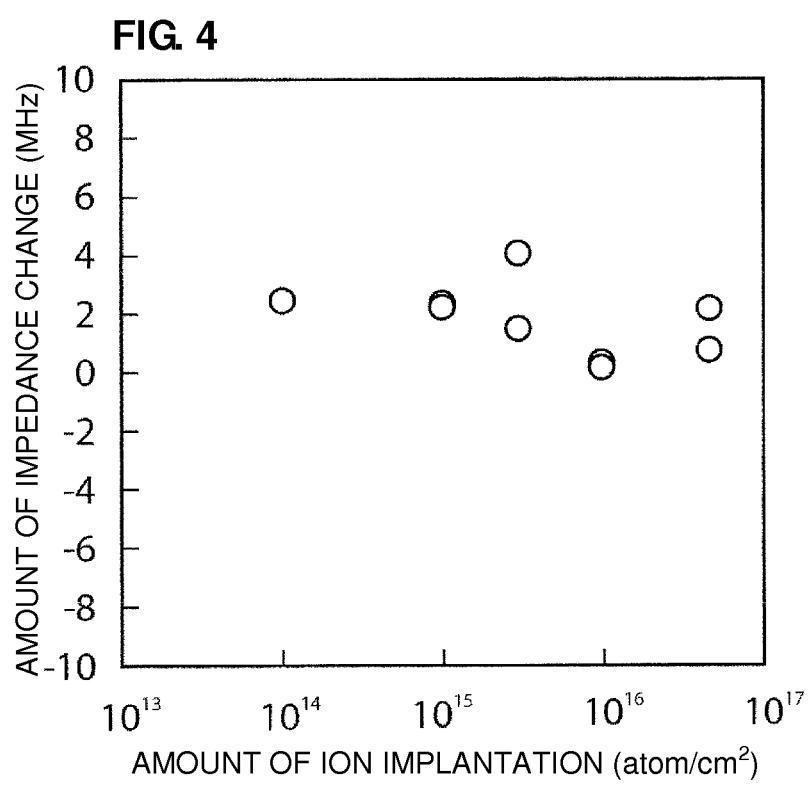

MANUFACTURING METHOD FOR BOUNDARY ACOUSTIC WAVE DEVICE AND BOUNDARY ACOUSTIC WAVE DEVICE

BACKGROUND OF THE INVENTION

1. Field of the Invention

The present invention relates to a manufacturing method for a boundary acoustic wave device preferably for use in a resonator, a bandpass filter, or the like, for example, and the boundary acoustic wave device, and also relates to a manufacturing method for a boundary acoustic wave device, which includes a process for adjustment of a frequency, and the boundary acoustic wave device, in more detail.

2. Description of the Related Art

In recent years, in place of surface acoustic wave devices, boundary acoustic wave devices have been drawing attention. In the boundary acoustic wave device, boundary acoustic waves propagate through a boundary between first and second media made of solid substances. Accordingly, in the boundary acoustic wave device, compared with a surface acoustic wave device, it is possible to promote the downsizing of the device. In addition, it is possible to achieve the simplification of a package structure.

When the boundary acoustic wave device is used as a filter or a resonator, it is necessary to set the frequency characteristics thereof with a high degree of accuracy. However, in the boundary acoustic wave device, an interdigital transducer (IDT) electrode exists at the boundary of the first and second media. Accordingly, unlike the surface acoustic wave device, it is difficult to adjust the frequency thereof.

In WO2008/062639 A1, an example of a method of adjusting a frequency of the boundary acoustic wave device is disclosed. As illustrated in FIG. 12, an IDT electrode 103 is disposed at the boundary of a first medium 101 and a second medium 102. The second medium 102 includes a medium layer 102a and a medium layer 102b, and a reforming medium layer 102c is disposed between the medium layers 102a and 102b.

In WO2008/062639 A1, the outer side portion of the second medium 102 is irradiated with laser light as illustrated by an arrow. Owing to the irradiation of the laser light, the reforming medium layer 102c is heated, and metal included in the reforming medium layer 102c is diffused within the second medium 102. It is supposed that, owing to the diffusion, a reforming portion is formed and hence it is possible to enhance adjustment of a frequency.

In the boundary acoustic wave device, the propagation energy of the boundary acoustic waves is concentrated into a portion near the boundary of the first medium 101 and the second medium 102. Accordingly, in the method of adjusting a frequency described in WO2008/062639 A1, in order to obtain desired frequency characteristics, it has been necessary to form a reforming portion near the boundary of media with a high degree of accuracy.

However, in the method of adjusting a frequency described in WO2008/062639 A1, it is necessary to keep the melting point of the reforming medium layer 102c low or to select material that easily becomes diffuse, as the reforming medium layer 102c, so that media other than the reforming medium layer 102c and the IDT electrode do not become diffuse, and there has been a problem that device design is largely constrained. In addition, in order to reform the reforming medium layer 102c or diffuse metal included in the reforming medium layer 102c into the surrounding media 102a and 102b, it is necessary to cause melting and a solidification action to occur near the melting point of the reforming medium layer 102c. However, if local heating is performed using a focused laser so as to cause the melting and the solidification to occur, the film quality or the diffusion state of the reforming layer becomes non-uniform, and it has been very difficult to adjust a frequency with a high degree of accuracy. Accordingly, it has been difficult to obtain a boundary acoustic wave device including desired frequency characteristics.

SUMMARY OF THE INVENTION

Accordingly, preferred embodiments of the present invention provide a manufacturing method for a boundary acoustic wave device, which is capable of easily and certainly obtaining the boundary acoustic wave device including desired frequency characteristics, and the boundary acoustic wave device.

According to a preferred embodiment of the present invention, a method of manufacturing a boundary acoustic wave device includes a process for preparing a laminated body including a first medium made of a piezoelectric substance, a second medium made of a dielectric that is laminated on the first medium, and an IDT electrode that is disposed at an interface between the first medium and the second medium, and a process for implanting ions or atoms from an outer side portion of the second medium and adjusting a frequency.

In a specific aspect of the manufacturing method for the boundary acoustic wave device according to a preferred embodiment of the present invention, when the wavelength of a boundary acoustic wave is $\lambda$, ions are distributed in a region located within about one $\lambda$ above and below the interface owing to the ion implantation. In this case, since the propagation energy of the boundary acoustic wave is concentrated into the region located within about one $\lambda$ above and below the interface, it is possible to adjust the frequency characteristics of the boundary acoustic wave device with a higher degree of accuracy.

In another specific aspect of the manufacturing method for the boundary acoustic wave device according to a preferred embodiment of the present invention, at the time of the ion implantation, ions of atoms whose atomic weights are greater than or equal to Li are implanted. In this case, since the ions of atoms whose atomic weights are large are implanted, the implanted ions are difficult to be extracted. Accordingly, it is possible to provide the boundary acoustic wave device whose frequency characteristics are stable.

In another specific aspect of the manufacturing method for the boundary acoustic wave device according to a preferred embodiment of the present invention, in the process for preparing the laminated body, the second medium is formed so that the thickness of the second medium becomes a thickness causing elastic waves excited by the IDT electrode to mainly include not boundary acoustic waves but surface acoustic waves. Furthermore, after the ion implantation process, a third medium including the same dielectric material as the second medium or a dielectric material different from the second medium is further formed on the second medium so that elastic waves excited by the IDT electrode mainly include boundary acoustic waves. In this case, since the thickness of the second medium is thin, it is possible to perform adjustment of frequency using small ion implantation energy. Accordingly, it is possible to perform adjustment of frequency using low-priced equipment. In addition, since the thickness of the second medium is thin, it is possible to easily implant ions whose atomic weights are large. When ions of atoms whose atomic weights are large are implanted, frequency characteristics greatly change. Accordingly, it is possible to reduce the amount of ions implantation with respect to the amount of adjustment of frequency, and it is possible to easily perform adjustment of frequency.

According to preferred embodiments of the present invention, the boundary acoustic wave device includes a first medium made of a piezoelectric body, a second medium made of a dielectric that is laminated on the first medium, and an IDT electrode that is disposed at an interface between the first medium and the second medium, and the first medium and/or the second medium includes an ion or atom implantation region.

In a specific aspect of the boundary acoustic wave device according to another preferred embodiment of the present invention, when the wavelength of a boundary acoustic wave is λ, a region located within about one λ above and below the interface is the ion or atom implantation region. In this case, it is possible to adjust the frequency characteristics of the boundary acoustic wave device with a higher degree of accuracy.

In another specific aspect of the boundary acoustic wave device according to a preferred embodiment of the present invention, the ions are ions of atoms whose atomic weights are greater than or equal to Li. In this case, since the implanted ions are difficult to be extracted, it is possible to provide the boundary acoustic wave device whose frequency characteristics are stable.

In another specific aspect of the boundary acoustic wave device according to a preferred embodiment of the present invention, the thickness of the second medium is a thickness causing elastic waves excited by the IDT electrode to mainly include not boundary acoustic waves but surface acoustic waves, and further includes a third medium, which is laminated on the second medium and includes the same dielectric material as the second medium or dielectric material different from the second medium. The third medium is arranged so that elastic waves excited by the IDT electrode mainly include boundary acoustic waves. In this case, since the thickness of the second medium is thin, less ion implantation energy is necessary. Accordingly, since it is possible to perform adjustment of frequency using low-priced equipment, it is possible to reduce the manufacturing cost of the boundary acoustic wave device. In addition, it is possible to easily implant ions whose atomic weights are large. Therefore, it is possible to easily perform adjustment of frequency.

According to the manufacturing method for the boundary acoustic wave device and the boundary acoustic wave device according to various preferred embodiments of the present invention, at a stage where the laminated body in which the IDT electrode is disposed at the interface between the first and second media is obtained, it is possible to adjust a frequency owing to the ion implantation. Accordingly, after the completion of the boundary acoustic wave device, it is possible to easily adjust the frequency so as to obtain target frequency characteristics. Alternatively, after the second medium has been formed so that elastic waves excited by the IDT electrode mainly include surface acoustic waves, it is possible to easily adjust the frequency owing to the ion implantation.

In addition, since the frequency is adjusted owing to the ion implantation, it is possible to certainly distribute ions to a portion near the interface between the first and second media. Therefore, it is possible to perform adjustment of frequency with a high degree of accuracy. According to various preferred embodiments of the present invention, it is possible to easily and certainly provide the boundary acoustic wave device including target frequency characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a pattern diagram illustrating vibration displacement distribution of boundary acoustic waves propagating through the boundary acoustic wave device according to the first preferred embodiment of the present invention.

FIG. 4 is a diagram illustrating a relationship between the amount of impedance change and the amount of ion implantation in the manufacturing method for the boundary acoustic wave device according to the first preferred embodiment of the present invention.

DETAILED DESCRIPTION OF THE PREFERRED EMBODIMENTS

Hereinafter, specific preferred embodiments of the present invention will be described with reference to drawings, thereby clarifying the present invention.

Figure 1A:
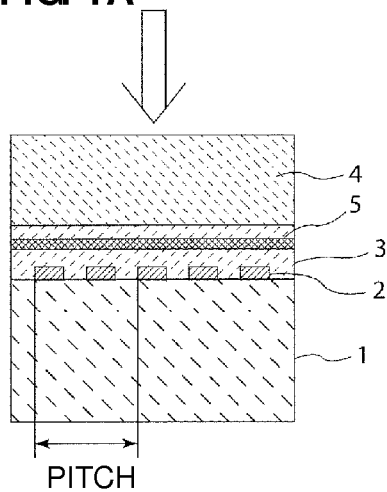
FIG. 1A is an elevational cross-sectional view for explaining a process in which a frequency is adjusted owing to ion implantation in a manufacturing method for a boundary acoustic wave device according to a preferred embodiment of the present invention.
Figure 1B:
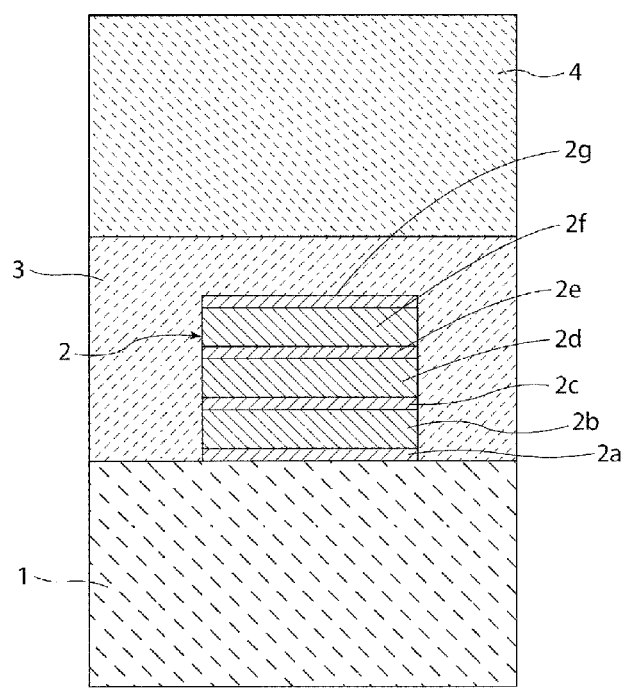
FIG. 1B is a partially enlarged elevational cross-sectional view for explaining an electrode structure of the boundary acoustic wave device.

A manufacturing method for a boundary acoustic wave device according to a preferred embodiment of the present invention will be described with reference to FIGS. 1A and 1B. First, a first medium 1 illustrated in FIG. 1A is prepared. As the first medium 1, in the present preferred embodiment, a substantially 25-degree Y-cut LiNbO$_3$ substrate is preferably used, for example. As a matter of fact, the first medium 1 may also be formed using another piezoelectric substance. As such a piezoelectric substance, LiNbO$_3$ whose Cut-Angles are other than the above-mentioned Cut-Angles, LiTaO$_3$, crystal, piezoelectric ceramics, or other suitable material may be used, for example. In addition, as the piezoelectric body, a laminated body including a piezoelectric film and a supporting substrate may be used in which the piezoelectric film is provided on the supporting substrate such as a glass substrate, an Si substrate, a sapphire substrate, or other suitable substrate, for example.

On the first medium 1, an IDT electrode 2 and a reflector not illustrated are formed. A forming method for the IDT electrode 2 is not limited to a specific method, and a thin-film forming method such as vapor deposition, sputtering, or other suitable method may be used, for example. In the present preferred embodiment, as the IDT electrode 2, an IDT electrode is formed that includes laminated metal films enlarged and illustrated in FIG. 1B. In the laminated metal films, starting from the bottom, these metal films, namely, a Ti film 2a, a Pt film 2b, a TiO$_2$ film 2c, an AlCu film 2d, a TiO$_2$ film 2e, a Pt film 2f, and an NiCr film 2g, are laminated in that order. The film thicknesses of individual metal films are as follows. In addition, the AlCu film is alloy whose main component is Al and that includes Cu.

NiCr/Pt/TiO$_2$/AlCu/TiO$_2$/Pt/Ti=about 10/22/20/225/20/36/10 (the unit thereof is nm).

The pitch of electrode fingers included in the IDT electrode and the reflector is, for example, about 2.01 μm, and the pitch of electrode fingers substantially corresponds to the wave length λ of a boundary acoustic wave at a response frequency of the boundary acoustic wave device. The intersecting width of the IDT electrode is about 28.7 μm, the number of electrode fingers of the IDT electrode is about 227, the numbers of electrode fingers of the reflectors disposed on both sides of the IDT electrode in a boundary acoustic wave propagation direction are individually about 31, and the ratio relative to the wavelength of the electrode finger width of each of the IDT electrodes and the reflector is about 0.25, for example.

After the above-mentioned IDT electrode 2 has been formed, an SiO$_2$ film 3 is formed. The film formation of the SiO$_2$ film 3 is performed using an arbitrary method such as sputtering or other suitable method, for example. The film thickness of the SiO$_2$ film 3 is preferably about 1213 nm, for example.

Next, on the SiO$_2$ film 3, the film of an SiN film 4 is formed preferably by sputtering. The film thickness of the SiN film 4 is preferably about 400 nm, for example.

The above-mentioned SiO$_2$ film 3 and SiN film 4 correspond to the second medium.

In addition, while, in FIG. 1A, not illustrated, an electrode extraction pad is formed in a process for forming the IDT electrode 2, so as to be electrically connected to the IDT electrode 2. In addition, using a photolithographic method, the SiO$_2$ film 3 and the SiN film 4 are subjected to patterning so that the SiO$_2$ film 3 and the SiN film 4 on the electrode extraction pad are removed.

In the laminated body obtained as described above, the frequency characteristics thereof are measured. In the present preferred embodiment, one port-type boundary acoustic wave resonator is configured in which the reflectors are provided on both sides of the IDT electrode 2. Accordingly, as the frequency characteristics, a resonance characteristic, an impedance characteristic and/or an impedance Smith chart, and the like are measured. When the time comes, as illustrated by an arrow in FIG. 1A, metal ions are implanted into the second medium from the outer side portion thereof, specifically, from above the SiN film using IMX-3500RS (a medium current density ion implantation apparatus) manufactured by ULVAC, Inc. In the present preferred embodiment, as the metal ions, Li ions are preferably implanted. In the ion implantation, it is possible to certainly distribute ions in the vicinity of the interface between the first medium 1 and the second medium including the SiO$_2$ film 3 and the SiN film 4. In such a way as described above, it is possible to form a region 5 into which ions are implanted, as illustrated in FIG. 1A. When the region 5 into which ions are implanted is formed, the propagation behaviors of the boundary acoustic waves excited by the IDT electrode 2 change, and the frequency characteristics thereof change.

In such a way as described above, it is possible to adjust the frequency characteristics owing to the ion implantation. A specific adjustment of frequency result due to the ion implantation will be described on the basis of a specific experimental example, later.

In the present preferred embodiment, as described above, only by performing the ion implantation from the outside after the laminated body has been obtained, it is possible to easily and certainly adjust the frequency of the boundary acoustic wave device.

In addition, while, in the above-mentioned preferred embodiment, the second medium is preferably formed using the SiO$_2$ film 3 and the SiN film 4, the second medium may also be configured using one type of dielectric. In addition, the materials used for configuring the second medium are not limited to SiO$_2$ or SiN, and various types of dielectrics may also be used.

Next, a specific experimental example will be described.

Figure 3:
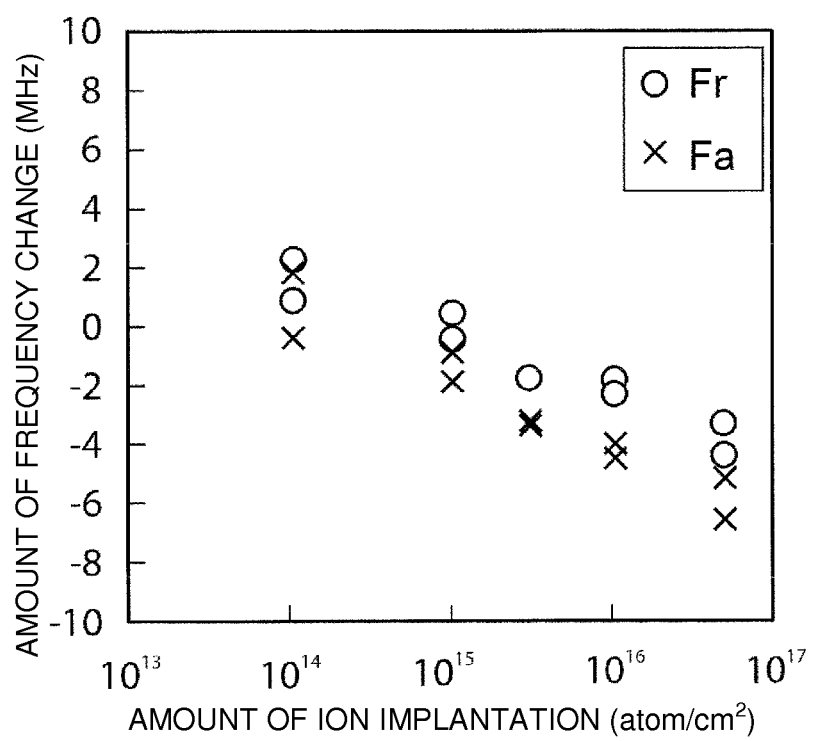
FIG. 3 is a diagram illustrating a relationship between the amount of frequency change and the amount of ion implantation in the manufacturing method for the boundary acoustic wave device according to the first preferred embodiment of the present invention.

After the laminated body illustrated in FIG. 1A has been prepared, Li$^+$ ions are implanted into the second medium from the top surface thereof with implantation energy being about 200 KeV, using IMX-3500RS (a medium current density ion implantation apparatus) manufactured by ULVAC, Inc, and hence frequency adjustment is performed. In this case, the amount of ion implantation is variously changed within a range from about $1\times10^{14}$ atom/cm$^2$ to about $1\times10^{17}$ atom/cm$^2$, for example, and frequency adjustment is performed. The results are illustrated in FIGS. 3 and 4. FIG. 3 illustrates a relationship between the amount of ion implantation and the amount of frequency change. In FIG. 3, "○" indicates a resonance frequency Fr, and "x" indicates an anti-resonant frequency Fa.

As is clear from FIG. 3, it is understood that the resonance frequency and the anti-resonant frequency decrease with an increase in the amount of ion implantation. Namely, it is understood that there are negative correlations between the amount of ion implantation and the resonance frequency and anti-resonant frequency. Accordingly, by changing the amount of ion implantation, it is possible to adjust a frequency so that the frequency becomes a target frequency.

In addition, FIG. 4 illustrates a relationship between the amount of ion implantation described above and the amount of impedance change. The amount of impedance change indicates the amount of change in a ratio of an impedance at the resonance frequency to an impedance at the anti-resonant frequency. As is clear from FIG. 4, it is understood that an impedance ratio is less changed even if ion implantation is performed.

Specific examples of the changes of the impedance characteristics and the phase characteristics when the above-mentioned amount of ion implantation is changed will be specifically illustrated in FIGS. 5A to 8B.

FIG. 5A, FIG. 6A, FIG. 7A, and FIG. 8A are diagrams individually illustrating impedance characteristics before and after ion implantation, and FIG. 5B, FIG. 6B, FIG. 7B, and FIG. 8B are diagrams individually illustrating phase characteristics before and after ion implantation. In FIG. 5A to FIG. 8B, solid lines indicate characteristics after ion implantation, and dashed lines indicate characteristics before ion implantation.

In addition, the amounts of ion implantation are as follows.

Figure 5A:
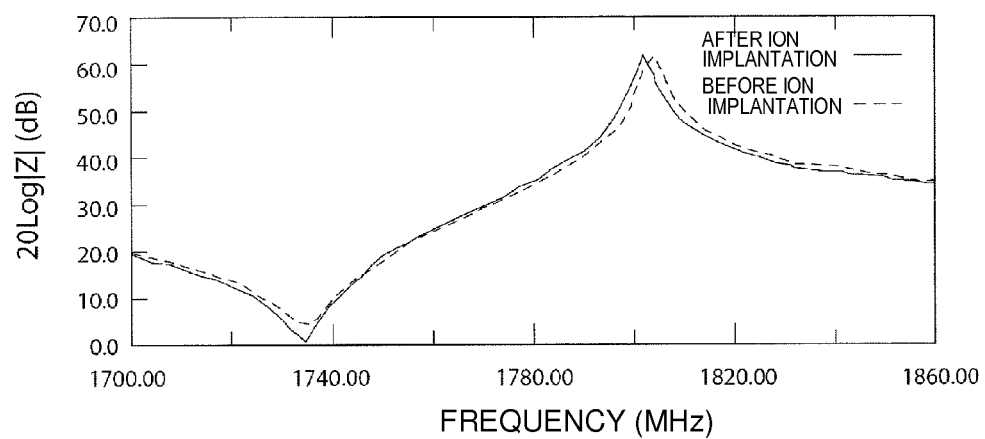
FIG. 5A is a diagram illustrating impedance characteristics before ion implantation is performed and after ion implantation has been performed with the amount of ion implantation being about $1 \times 10^{15}$ atom/cm$^2$, in the manufacturing method for the boundary acoustic wave device according to the first preferred embodiment.
Figure 5B:
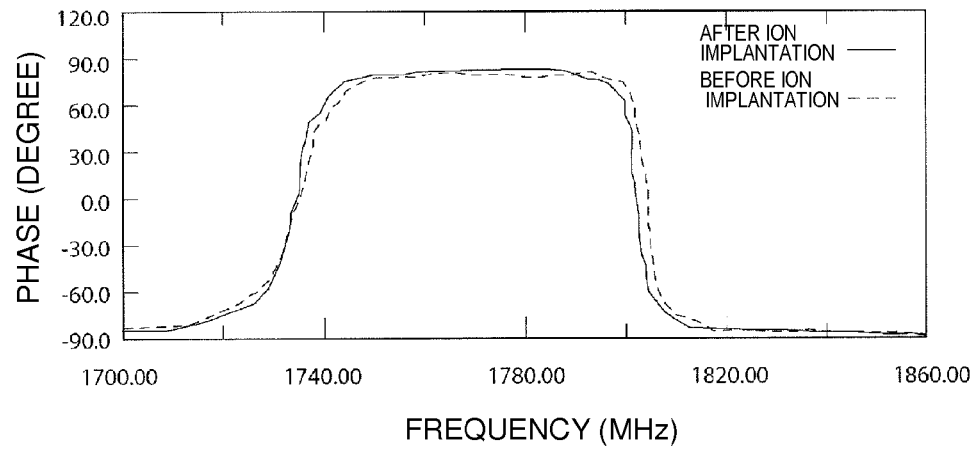
FIG. 5B is a diagram illustrating phase characteristics before ion implantation is performed and after ion implantation has been performed with the amount of ion implantation being about $1 \times 10^{15}$ atom/cm$^2$, in the manufacturing method for the boundary acoustic wave device according to the first preferred embodiment of the present invention.
Figure 6A:
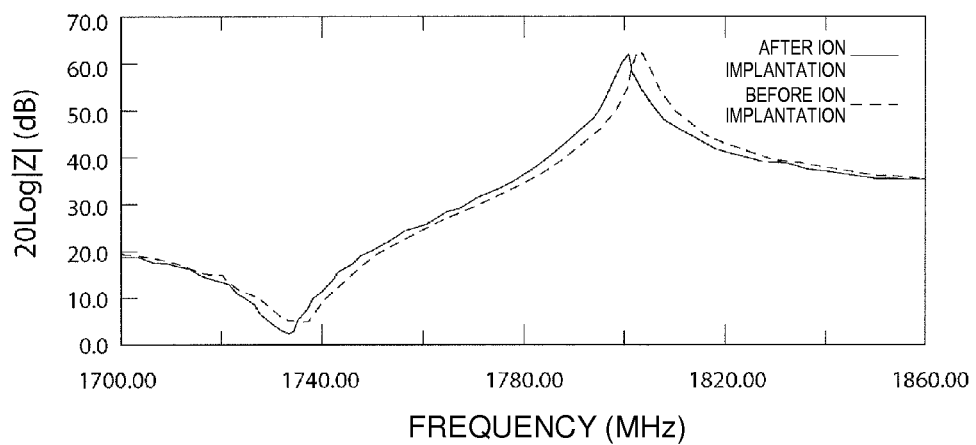
FIG. 6A is a diagram illustrating impedance characteristics before ion implantation is performed and after ion implantation has been performed with the amount of ion implantation being about $3 \times 10^{15}$ atom/cm$^2$, in the manufacturing method for the boundary acoustic wave device according to the first preferred embodiment.
Figure 6B:
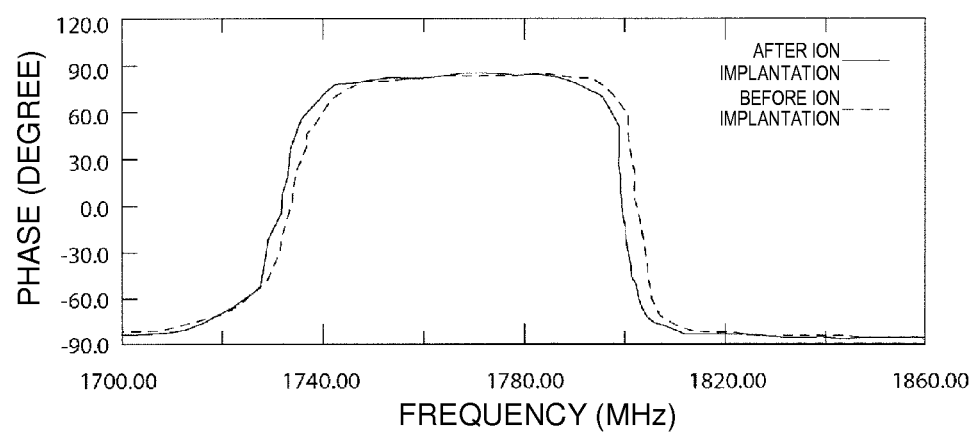
FIG. 6B is a diagram illustrating phase characteristics before ion implantation is performed and after ion implantation has been performed with the amount of ion implantation being about $3 \times 10^{15}$ atom/cm$^2$, in the manufacturing method for the boundary acoustic wave device according to the first preferred embodiment of the present invention.
Figure 7A:
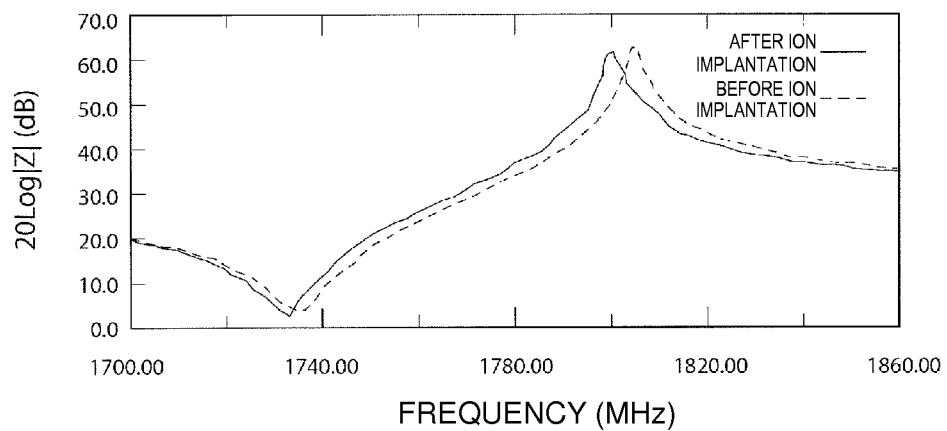
FIG. 7A is a diagram illustrating impedance characteristics before ion implantation is performed and after ion implantation has been performed with the amount of ion implantation being about $1 \times 10^{16}$ atom/cm$^2$, in the manufacturing method for the boundary acoustic wave device according to the first preferred embodiment.
Figure 7B:
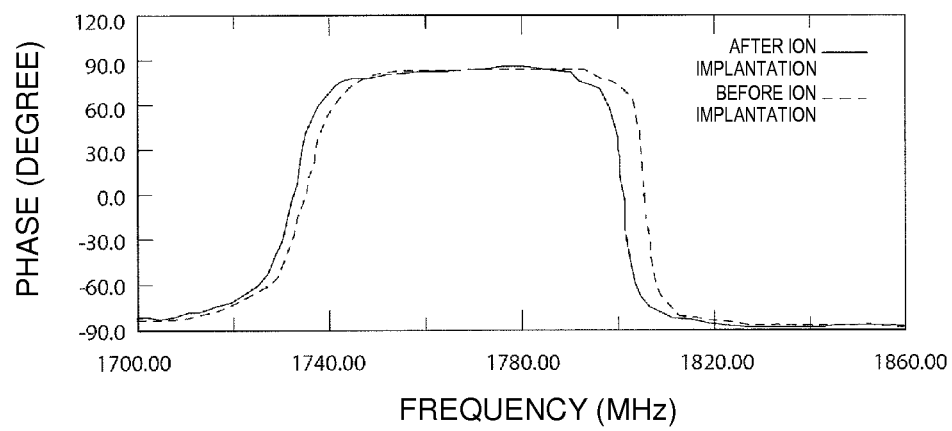
FIG. 7B is a diagram illustrating phase characteristics before ion implantation is performed and after ion implantation has been performed with the amount of ion implantation being about $1 \times 10^{16}$ atom/cm$^2$, in the manufacturing method for the boundary acoustic wave device according to the first preferred embodiment of the present invention.
Figure 8A:
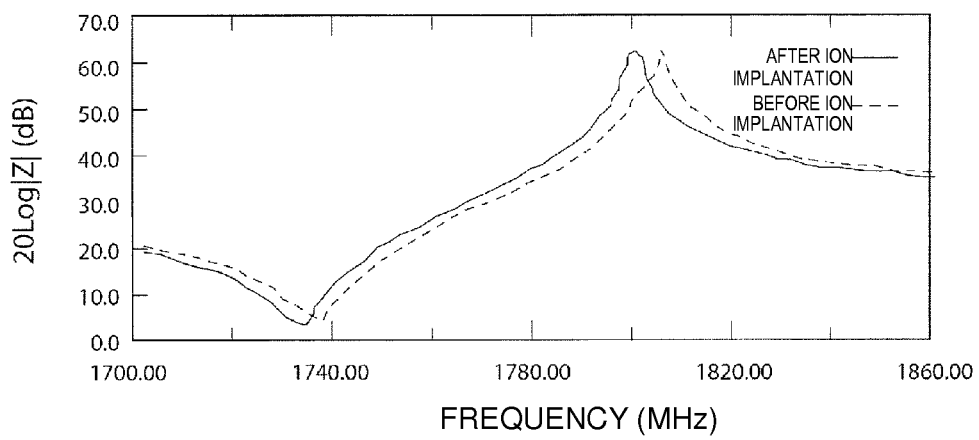
FIG. 8A is a diagram illustrating impedance characteristics before ion implantation is performed and after ion implantation has been performed with the amount of ion implantation being about $5 \times 10^{16}$ atom/cm$^2$, in the manufacturing method for the boundary acoustic wave device according to the first preferred embodiment.
Figure 8B:
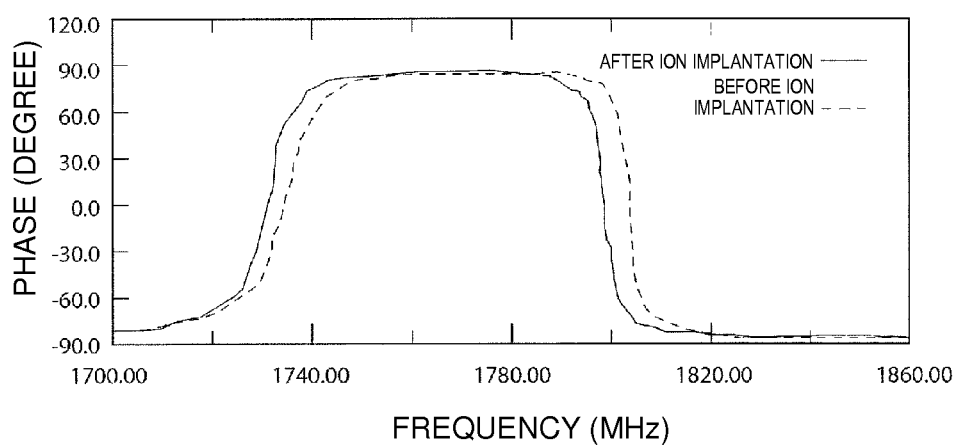
FIG. 8B is a diagram illustrating phase characteristics before ion implantation is performed and after ion implantation has been performed with the amount of ion implantation being about $5 \times 10^{16}$ atom/cm$^2$, in the manufacturing method for the boundary acoustic wave device according to the first preferred embodiment of the present invention.

In FIGS. 5A and 5B, the amounts of ion implantation are about $1\times10^{15}$ atom/cm$^2$, in FIGS. 6A and 6B, the amounts of ion implantation are about $3\times10^{15}$ atom/cm$^2$, in FIGS. 7A and 7B, the amounts of ion implantation are about $1\times10^{16}$ atom/cm$^2$, and in FIGS. 8A and 8B, the amounts of ion implantation are about $5\times10^{16}$ atom/cm$^2$.

The results in FIG. 5A to 8B correspond to the result summarized in FIGS. 3 and 4.

In addition, since the amounts of changes in the impedance change and the phase change are small in a case in which the amounts of ion implantation are about $1\times10^{14}$ atom/cm$^2$ in FIGS. 3 and 4, the illustration thereof is omitted.

As is clear from the above-mentioned experimental examples, it is understood that, by controlling the amount of ion implantation, it is possible to adjust the resonance frequency and the anti-resonant frequency with a high degree of accuracy.

In the above-mentioned preferred embodiment, owing to the ion implantation, it is possible to adjust the frequency with a high degree of accuracy. This may be because, owing to the ion implantation, it is possible to distribute ions in the vicinity of the boundary of the first and second media, as in the region 5 illustrated in FIG. 1A. As illustrated in FIG. 2, on the basis of the vibration displacement distribution of an elastic wave of the above-mentioned boundary acoustic wave device, the energy of the elastic wave is concentrated into a portion near the boundary of the first medium and the second medium. The depth 0.0 of a vertical axis in FIG. 2 indicates the boundary between the first medium and the second medium, a minus direction corresponds to a first medium side, and a plus direction corresponds to a second medium side. In FIG. 2, U1 indicates displacement distribution in a propagation direction, U2 indicates a vibration displacement component in a direction vertical to the propagation direction and parallel to the boundary, and U3 indicates a vibration displacement component in a direction vertical to the propagation direction and the boundary. In addition, in many cases, a boundary acoustic wave propagates as one propagation mode with the vibration displacement components of U1, U2, and U3 being coupled to one another. As is clear from FIG. 2, when the wave length of the boundary acoustic wave is λ, the energy of the elastic wave is distributed within a range where a depth is about 0.0±1.0λ. In addition, most of the energy of the elastic wave is concentrated into a range where a depth is about 0.0±0.7λ, and the energy thereof gradually increases as it gets closer to the depth 0.0, namely, the boundary of the first medium and the second medium. In addition, from among SiO$_2$ and SiN included in the second medium, on the inner side of SiO$_2$ whose acoustic velocity is lower, vibration displacement rapidly increases. Accordingly, by distributing ions in a portion located within about one λ above and below the above-mentioned boundary owing to ion implantation, it is possible to change the propagation behavior of the elastic wave, and it is possible to more greatly change the propagation behavior of the elastic wave within a range of about 0.7λ above and below the boundary. Namely, it is possible to greatly change the frequency. Furthermore, it is understood that, when the medium 2 is configured by laminating a film whose acoustic velocity is high and a film whose acoustic velocity is low, much energy is distributed in the film whose acoustic velocity is low. Accordingly, it is possible to adjust the frequency to an even greater extent.

When the distribution of Li ions in the above-mentioned preferred embodiment is analyzed on the basis of an LSS theory (for example, non-patent literature J. Lindhard et al.; "Range Concepts and Heavy Ion Ranges," Mat. Fys. Medd. Dan. Vid. Selsk., Vol. 33, p. 1-39, 1963), it is confirmed that Li is distributed with a position in the film of the SiO$_2$ film 3 as the center thereof, the position being located about 770 nm (about 0.38λ because of λ=2.01 μm) away from the boundary of the LiNbO$_3$ substrate 1 and the SiO$_2$ film 3.

In the above-mentioned experimental example, the frequency characteristics greatly change owing to the ion implantation. This may be because the region 5 illustrated in FIG. 1A is formed in a region of about 0.38λ located near the boundary of the first medium and the second medium, in which the energy of the elastic wave is distributed. For that matter, this may be because the region 5 is formed within SiO$_2$ located near the boundary in the medium 2 configured by laminating SiN whose acoustic velocity is high and SiO$_2$ whose acoustic velocity is low, and hence a greater frequency change is obtained.

In addition, in the above-mentioned preferred embodiment, since the implantation energy is reduced to about 200 keV owing to the restriction of the ion implantation apparatus used for ion implantation, the thickness of the SiN film included in the second medium is about 400 nm. Therefore, vibration energy is slightly distributed on the SiN surface. Therefore, in the same procedure as in the above-mentioned preferred embodiment, a sample subjected to ion implantation and a sample not subjected to ion implantation are prepared, the film of SiN is formed to be about 1600 nm in thickness on the SiN film whose thickness is about 400 nm after ion implantation, thereby forming a complete boundary wave whose vibration energy is not distributed on the surface, and a frequency difference between the sample subjected to ion implantation and the sample not subjected to ion implantation is compared. As a result, the same frequency change as the frequency changed owing to the ion implantation is confirmed. On the basis of these studies, it may be judged that the frequency change due to the ion implantation does not result from the change of thickness on the surface of the SiN film of about 400 nm, due to ion milling but results from the propagation behavior of the boundary wave, changed by distributing Li in a portion located near the boundary using ion implantation and altering the elastic constant of the medium 2.

Accordingly, in various preferred embodiments of the present invention, it is desirable that it is only necessary to perform ion implantation on the region located within a range of about one λ above and below the above-mentioned boundary, in the first medium and/or second medium. When ions are implanted into a region ranging from about 0.7λ to about 1λ above and below the boundary, a great frequency change is not obtained. However, it may be expected that the frequency moderately changes with respect to the amount of ion implantation. Accordingly, it is suitable for the fine adjustment of the frequency. On the other hand, when manufacturing variations are large and frequency adjustment is performed so as to greatly change a frequency, it is desirable that ions are implanted into the region located within a range of about 0.7λ above and below the boundary. Accordingly, it is possible to greatly change the frequency.

Furthermore, it is also desirable that the first medium or the second medium has a laminate structure. Consequently, by implanting ions into a medium layer located near the boundary in which energy steeply increases, it is possible to change the frequency to a greater extent. Accordingly, it is also possible to deal with a case in which manufacturing variations are large, which is desirable.

Figure 9:
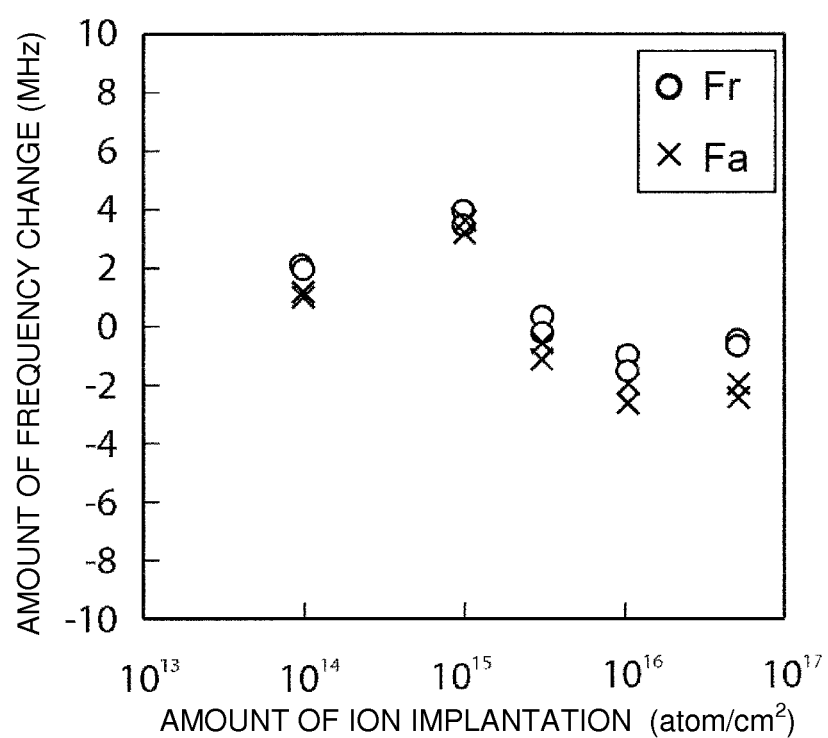
FIG. 9 is a diagram illustrating a relationship between the amount of ion implantation and the amount of frequency change when He$^+$ ions are implanted.
Figure 10:
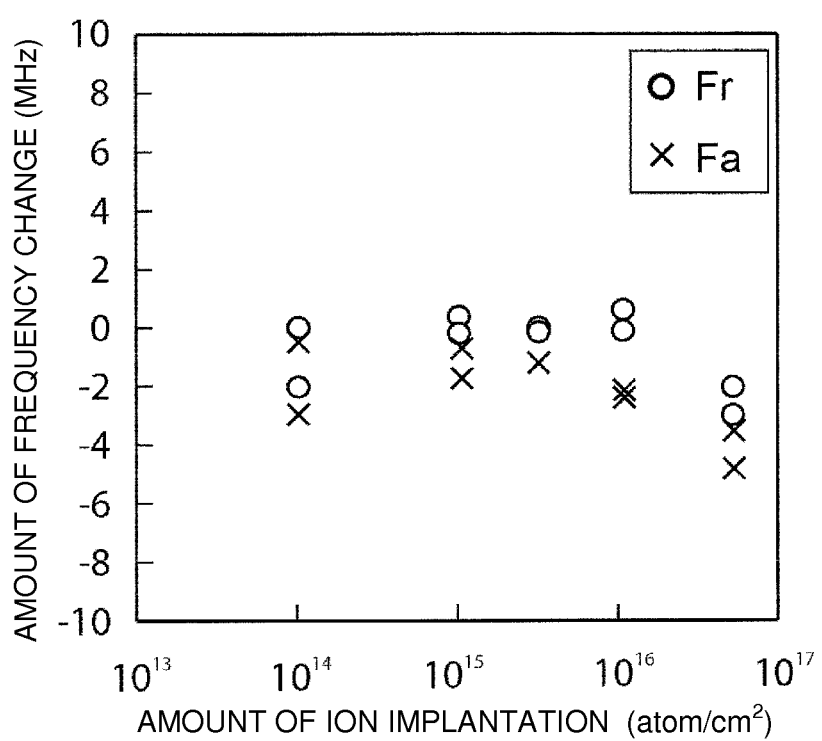
FIG. 10 is a diagram illustrating a relationship between the amount of ion implantation and the amount of frequency change when B$^+$ ions are implanted.

In the same way as the above-mentioned experimental example, frequency adjustment is tried. In this regard, however, ionic species to be implanted are $He^+$ and $B^+$ ions. The results are illustrated in FIGS. 9 and 10. FIG. 9 illustrates a relationship between the amount of ion implantation and the amount of frequency change when $He^+$ ions are implanted, and FIG. 10 illustrates a relationship between the amount of ion implantation and the amount of frequency change when $B^+$ ions are implanted. Also in FIGS. 9 and 10, in the same way as in FIG. 3, "○" indicates the resonance frequency Fr, and "x" indicates the anti-resonant frequency Fa.

As is clear from FIG. 9, when He ions are implanted, there is a poor correlation between the amount of implantation and the amount of frequency change while the frequency characteristics change. This may be because, in the case of He ions, implanted ion tends to be easily extracted and hence the effect of implantation varies. Accordingly, optimally, it is desirable that ions of atoms whose atomic weights are greater than He, namely, ions of Li or ions of atoms whose atomic weights are greater than Li, are implanted. As a matter of fact, as is clear from FIG. 9, when $He^+$ ions are implanted, it is also possible to change the resonance frequency and the anti-resonant frequency. Accordingly, it is also possible to adjust the frequency characteristics.

In the same way, as illustrated in FIG. 10, when $B^+$ ions are implanted, there is a minimal change in the correlation between the amount of implantation and the amount of frequency change. However, it is also possible to adjust the frequency characteristics. Compared with Li, B has a large atomic weight. Therefore, even if $B^+$ ions are implanted with about the same 200 keV as Li, an implantation depth becomes shallow and the region 5 illustrated in FIG. 1A is formed with a position as the center thereof, the position being located about 0.45λ away from the boundary of the first medium and the second medium (0.45λ corresponds to a position within $SiO_2$ because the thickness of $SiO_2$ is about 0.6λ). Consequently, it may be considered that the amount of frequency change becomes small. In addition, since the atomic weight of B is large, the change of the density of the region 5 due to the implanted ions becomes large, and the produced distortion of a surrounding film becomes large. Therefore, when the same amount of ions is implanted into a same depth, the amount of change in B becomes large, compared with Li.

Figure 11A:
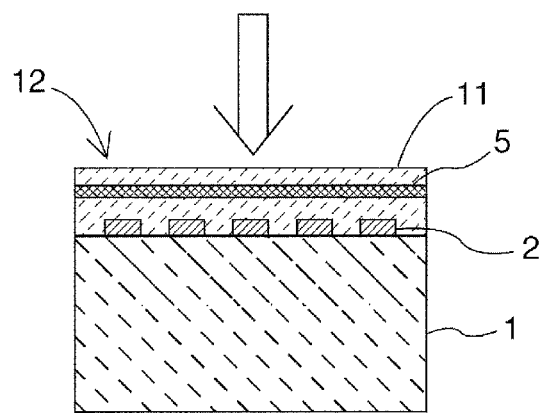
FIGS. 11A and 11B are individual schematic elevational cross-sectional views illustrating a manufacturing method for a boundary acoustic wave device according to another preferred embodiment of the present invention.
Figure 11B:
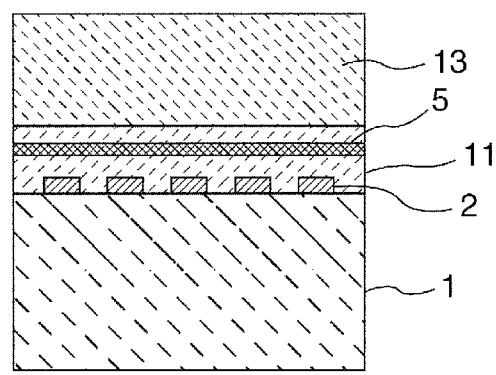
Figure 12:
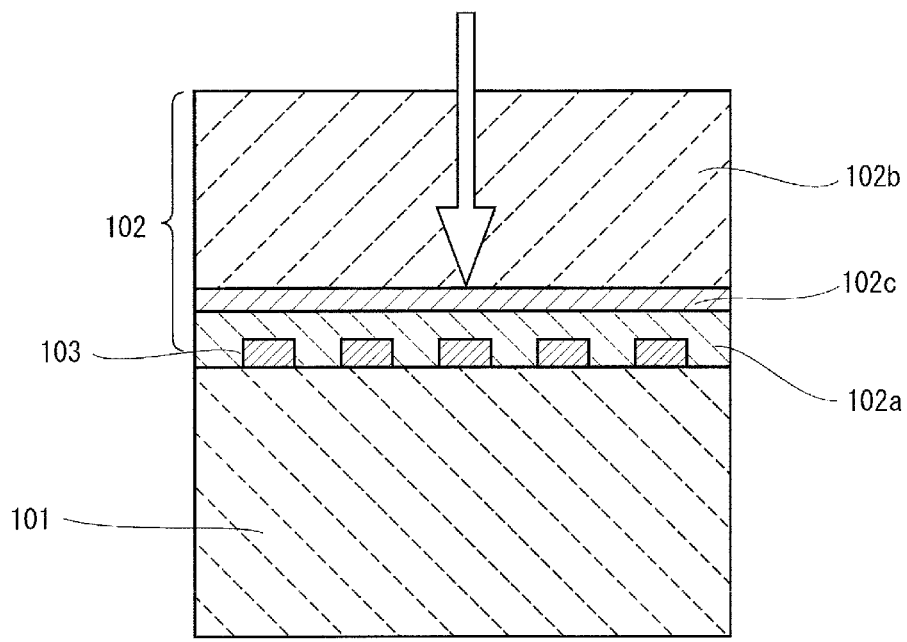
FIG. 12 is a schematic elevational cross-sectional view for explaining a frequency adjusting method for a boundary acoustic wave device of the related art.

FIGS. 11A and 11B are individual schematic elevational cross-sectional views illustrating a manufacturing method for a boundary acoustic wave device according to another preferred embodiment of the present invention. In the second preferred embodiment, as illustrated in FIG. 11A, first, a laminated body 12 is prepared in which a first medium 1, an IDT electrode 2, and a second medium 11 are laminated in this order. The first medium 1, the IDT electrode 2, and the second medium 11 may be configured using the same materials as in the above-mentioned preferred embodiment. In this regard, however, in the present preferred embodiment, the film of the second medium 11 is preferably formed so that elastic waves excited when the IDT electrode 2 is excited mainly include not boundary acoustic waves but surface acoustic waves.

In this stage, ion implantation is performed as illustrated by an arrow, the region 5 is formed, and frequency adjustment is performed. Namely, in the stage of the laminated body 12 that is a surface acoustic wave device, frequency adjustment is performed using ion implantation. As described above, frequency adjustment may be performed in the stage of the surface acoustic wave device.

Next, after frequency adjustment, a third medium 13 is laminated on the second medium 11. The third medium 13 may be formed using the same dielectric material as the second medium 11 or formed using dielectric material different from the second medium 11.

In this regard, however, the third medium 13 is laminated so that, by laminating the third medium 13, elastic waves excited by applying a voltage to the IDT electrode 2 are boundary acoustic waves. Namely, the total thickness of the second medium 11 and the third medium 13 is set so that the excited elastic waves are boundary acoustic waves, and hence the boundary acoustic wave device is obtained.

In the present preferred embodiment, in the stage of the laminated body 12 that is a surface acoustic wave device, frequency adjustment is performed. Accordingly, also in the present preferred embodiment, while the IDT electrode 2 is embedded between the first and second media, it is possible to perform frequency adjustment with a high degree of accuracy, by performing the ion implantation from the outside. Accordingly, also in the present preferred embodiment, it is possible to easily and certainly obtain the boundary acoustic wave device having ultimate target frequency characteristics.

In addition, the effects and advantages of various preferred embodiments of the present invention are due to the change in the density or the elastic constant of a medium in a region in which the energy of boundary waves are distributed, the change being caused by the change in the density or the distortion due to implanted particles. Accordingly, with respect to the effects and advantages of various preferred embodiments of the present invention, the implanted particles are not limited to ions. In addition, even if electrons are supplied to accelerated ions using a neutralizer or the like to neutralize ions, and atoms obtained by neutralization are implanted, the same advantageous effects may be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A boundary acoustic wave device comprising:
a first medium made of a piezoelectric body;
a second medium made of a dielectric laminated on the first medium; and
an IDT electrode disposed at an interface between the first medium and the second medium; wherein
the first medium and/or the second medium includes an ion or atom implantation region.

2. The boundary acoustic wave device according to claim 1, wherein a wavelength of a boundary acoustic wave is $\lambda$, and a region located within about one $\lambda$ above and below the interface is the ion or atom implantation region.

3. The boundary acoustic wave device according to claim 1, wherein the ions are ions of atoms whose atomic weights are greater than or equal to Li.

4. The boundary acoustic wave device according to claim 1, wherein a thickness of the second medium is a thickness causing elastic waves excited by the IDT electrode to mainly include not boundary acoustic waves but surface acoustic waves, wherein the boundary acoustic wave device further comprises:
a third medium laminated on the second medium and including the same dielectric material as the second medium or dielectric material different from the second medium, wherein the third medium is arranged so that elastic waves excited by the IDT electrode mainly include boundary acoustic waves.

* * * * *